United States Patent
Arimochi et al.

(10) Patent No.: US 6,642,099 B2
(45) Date of Patent: Nov. 4, 2003

(54) METHOD OF MANUFACTURING COMPOUND SEMICONDUCTOR DEVICE

(75) Inventors: Kenji Arimochi, Yamanashi (JP); Tsutom Igarashi, Yamanashi (JP); Mitsuji Nunokawa, Yamanashi (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 0 days.

(21) Appl. No.: 10/139,238

(22) Filed: May 7, 2002

(65) Prior Publication Data

US 2002/0130389 A1 Sep. 19, 2002

Related U.S. Application Data

(62) Division of application No. 09/471,399, filed on Dec. 23, 1999, now Pat. No. 6,404,004.

(30) Foreign Application Priority Data

Apr. 30, 1999 (JP) ............................. 11-123870

(51) Int. Cl.[7] ...................... H01L 21/8242; H01L 21/20
(52) U.S. Cl. ...................... 438/244; 438/253; 438/387; 438/396
(58) Field of Search ................................. 438/253, 254, 438/396, 397, 398, 238, 239, 386, 399, 244, 387, 250, 393, 210, 329; 257/296, 306, 307, 308, 906–908

(56) References Cited

U.S. PATENT DOCUMENTS 5,846,600 A * 12/1998 Yamada et al. .............. 427/213
5,864,153 A *  1/1999 Nagel et al. ................. 257/296
6,130,449 A * 10/2000 Matsuoka et al. ........... 257/296

\* cited by examiner

*Primary Examiner*—Wael Fahmy
*Assistant Examiner*—Dilinh Nguyen
(74) *Attorney, Agent, or Firm*—Armstrong, Westerman & Hattori, LLP

(57) ABSTRACT

There is provided a compound semiconductor device having a capacitor, to prevent a leakage current flowing between an upper electrode and a lower electrode of the capacitor via an insulating protective film. The compound semiconductor device comprises a first electrode of a capacitor formed on a compound semiconductor substrate via a first insulating film, a dielectric film of the capacitor formed on the first electrode, a second electrode of a capacitor formed on the dielectric film, a second insulating film for covering an upper surface and side surfaces of the second electrode, and an insulating protective film for covering the second insulating film, the dielectric film, the first electrode and the first insulating film, and having a hydrogen containing rate which is larger than the second insulating film.

6 Claims, 9 Drawing Sheets

METHOD OF MANUFACTURING COMPOUND SEMICONDUCTOR DEVICE

This application is a divisional of prior application Ser. No. 09/471,399, filed Dec. 23, 1999, now U.S. Pat. No. 6,404,004.

BACKGROUND OF THE INVENTION

1. Field of the Invention

The present invention relates to a compound semiconductor device and a method of manufacturing the same and, more particularly, a compound semiconductor device having a capacitor formed on a compound semiconductor layer and a method of manufacturing the same.

2. Description of the Prior Art

As the compound semiconductor device, the monolithic microwave IC (MMIC) having the field effect transistor (FET), the capacitor, etc. has been known.

As the steps of manufacturing such compound semiconductor device, for example, the FET having a gate electrode whose gate length is less than 1 μm is formed, then the capacitor is formed, and then all of the FET and the capacitor are covered with the insulating protective film having good coverage.

A configuration of such capacitor will be explained with reference to FIG. 1 hereunder.

In FIG. 1, an underlying insulating film 102 is formed on a semiconductor substrate 101 such as GaAs, and a lower electrode 104, a dielectric film 105, and an upper electrode 106 constituting the capacitor 103 are formed in sequence on the underlying insulating film 102. The capacitor is covered with an insulating protective film 107. The lower electrode 104 and the upper electrode 106 come into contact with the insulating protective film 107.

Since the insulating protective film 107 is formed to cover the FET (not shown) together with the capacitor 103, good coverage and low stress are requested for such insulating protective film 107. A weak stress film can be obtained by forming a low density film to be thin such as about 40 to 60 nm.

However, according to the inventor's experiment, it becomes apparent that a leakage current flows from the upper electrode to the lower electrode via the insulating protective film 107 in the capacitor.

As such insulating protective film, for example, the silicon nitride film which is formed by the ultraviolet (UV)-CVD method is employed. The hydrogen containing rate in the low density silicon nitride film is in excess of 30%. The silicon nitride film is grown at the substrate temperature of 200 to 400° C.

If the silicon nitride film is formed at the substrate temperature of more than 600° C., the high density film can be obtained because the hydrogen containing rate is reduced lower than 30%. However, if the substrate temperature is increased up to 600° C., silicon serving as the impurity doped in the compound semiconductor substrate 101 is activated and moved therein. Therefore, such an undesired phenomenon peculiar to the compound semiconductor device is caused that crystal defect is produced in the compound semiconductor substrate.

If the film thickness of the insulating protective film 107 is formed thicker than 60 nm, there is such a disadvantage that the piezo effect is generated in the compound semiconductor substrate around the gate electrode of the FET, due to the stress by the insulating protective film 107, to thus generate a parasitic capacitance.

SUMMARY OF THE INVENTION

It is an object of the present invention to provide a compound semiconductor device having a structure which is capable of reducing a leakage current flowing between an upper electrode and a lower electrode of a capacitor via an insulating protective film and a method of manufacturing the same.

The above subject can be overcome by providing a compound semiconductor device comprising a first electrode of a capacitor, formed on a compound semiconductor substrate via a first insulating film; a dielectric film of the capacitor, formed on the first electrode; a second electrode of a capacitor, formed on the dielectric film; a second insulating film for covering an upper surface and side surfaces of the second electrode; and an insulating protective film for covering the second insulating film, the dielectric film, the first electrode and the first insulating film, and having a hydrogen containing rate which is larger than the second insulating film.

According to the present invention, in the capacitor including the first electrode, the dielectric film, and the second electrode, the first electrode is selectively covered with the insulating film which has the low hydrogen containing rate, and also all the capacitor including the insulating film and the substrate are covered with the insulating protective film which has good coverage and has the high hydrogen containing rate.

Therefore, direct contact between the first electrode and the second electrode can be avoided by the insulating protective film, so that the leakage current can be prevented from flowing between the first electrode and the second electrode via the insulating protective film.

If the plasma CVD method is employed as the growth method of the second insulating film in the event that the second insulating film for covering selectively the second electrode is formed of the silicon nitride or the silicon nitride oxide ($SiO_xN_y$ (x, y are component number)), the second insulating film can be formed at the substrate temperature of less than 400° C. Therefore, movement of the impurity is hard to cause in the compound semiconductor substrate below the second insulating film, so that generation of the crystal defect in the compound semiconductor substrate can be prevented.

DETAILED DESCRIPTION OF THE PREFERRED EMBODIMENTS

Embodiments of the present invention will be explained with reference to the accompanying drawings hereinafter.

(First Embodiment)

FIGS. 2A to 2K are showing steps of manufacturing a compound semiconductor device according to a first embodiment of the present invention.

Figure 1:
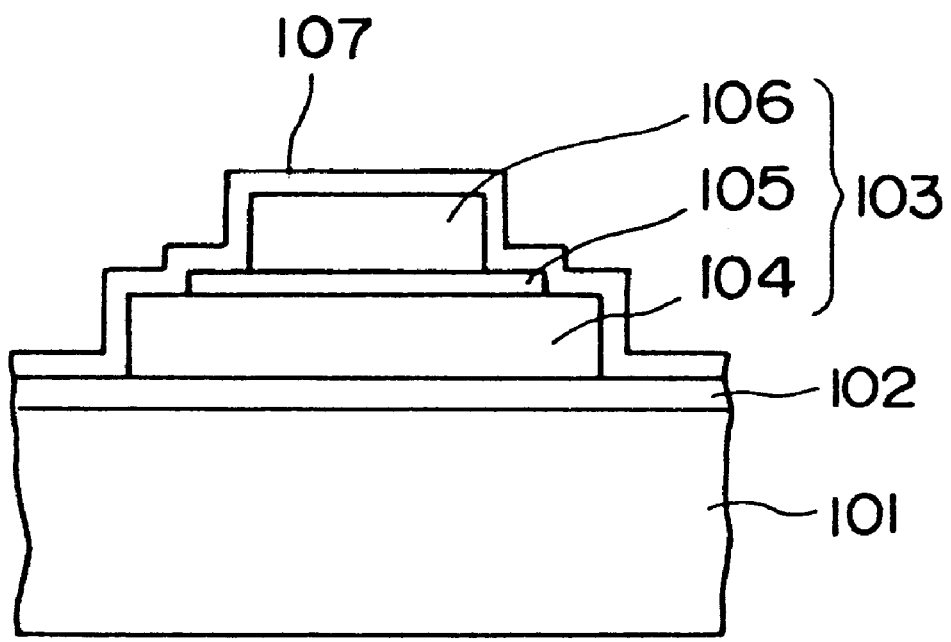
FIG. 1 is a sectional view showing the capacitor in the prior art.
Figure 2A:
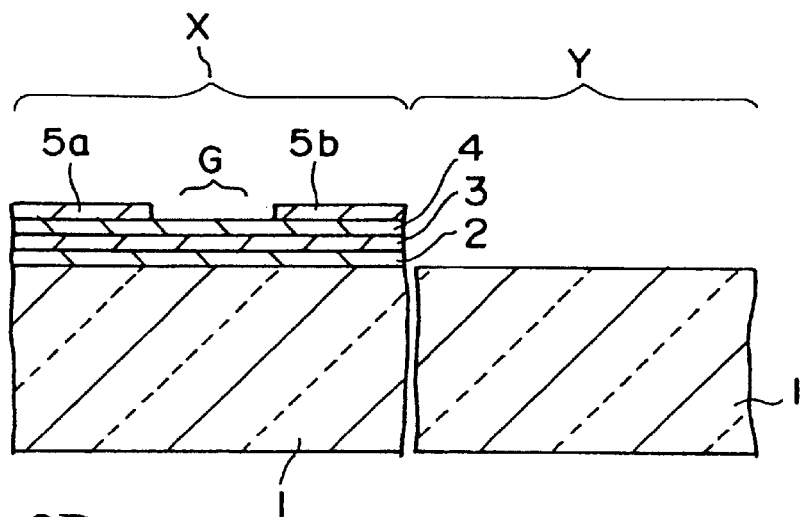
FIGS. 2A to 2K are showing steps of manufacturing a compound semiconductor device according to a first embodiment of the present invention.

First, as shown in FIG. 2A, a channel layer 2 formed of undoped InGaAs, a carrier supplying layer 3 formed of $n^+$ type AlGaAs, and a Schottky layer 4 formed of undoped AlGaAs are formed in sequence on a transistor forming region of a compound semiconductor substrate 1 formed of semi-insulating GaAs. Then, cap layers 5a, 5b formed of $n^+$ type GaAs are formed in a source region and a drain region of the Schottky layer 4 respectively. A gate electrode forming region G is assured between the source region and the drain region. As the n type impurity contained in the carrier supplying layer 3, the cap layers 5a, 5b, etc., for example, there is silicon which is doped by silane.

Figure 2B:
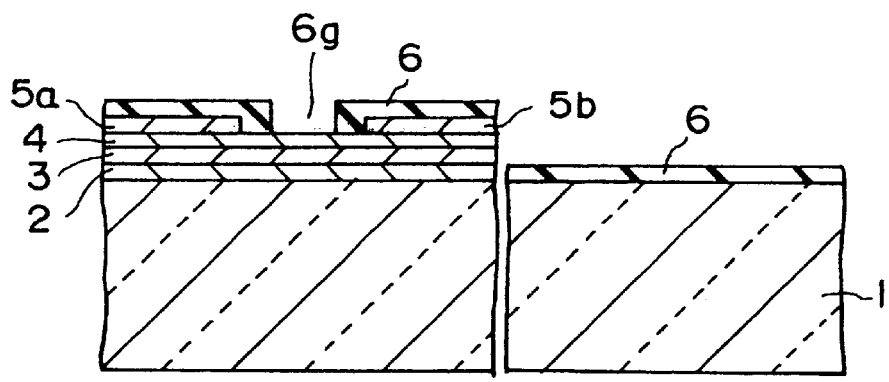

Under this condition, as shown in FIG. 2B, a first insulating film 6 is formed on two cap layers 5a, 5b, the Schottky layer 4 located between the cap layers 5a, 5b, and a capacitor forming region Y of the compound semiconductor substrate 1. The first insulating film 6 is formed of silicon nitride with the hydrogen containing rate of less than 30 at. % to have a thickness of 30 to 40 nm.

The silicon nitride is formed by the plasma CVD method. As the growth conditions, a mixed gas of silane ($SiH_4$) and nitrogen ($N_2$) is employed as a growth gas, a gas pressure is set to 0.1 to 0.3 Torr, a high frequency power applied to the plasma generating region is set to 450 to 470 W, and a substrate temperature is set to 240 to 260° C.

As the first insulating film 6, a silicon dioxide ($SiO_2$) film which is formed by the atmospheric pressure CVD method to have the hydrogen containing rate of less than 30 at. % and a film thickness of 200 to 400 nm may be employed.

Then, an opening 6g is formed in the gate electrode forming region G by patterning the first insulating film 6 by virtue of the photolithography method.

Figure 2C:
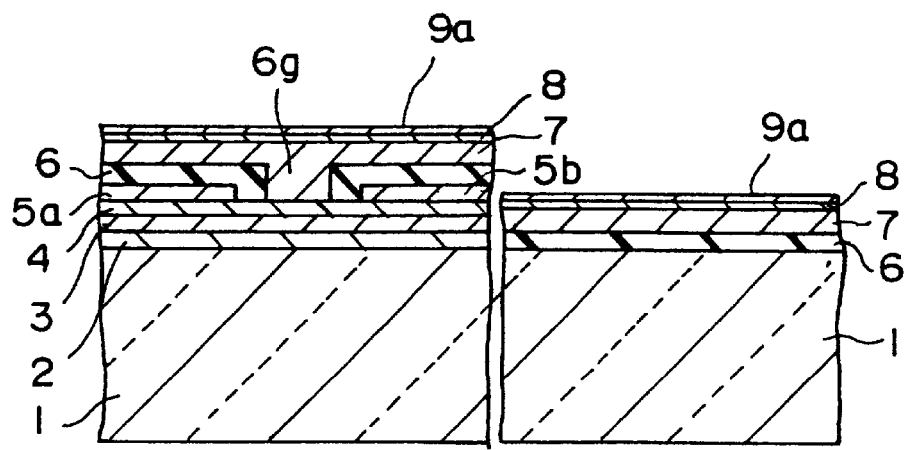

Then, as shown in FIG. 2C, a tungsten silicide (WSi) film 7 of 100 to 300 nm thickness, a first titanium (Ti) film 8 of 3 to 10 nm thickness, and a first gold (Au) film 9a of 100 to 400 nm thickness are formed in sequence on the first insulating film 6 and in the opening 6g by the sputter method.

Figure 2D:
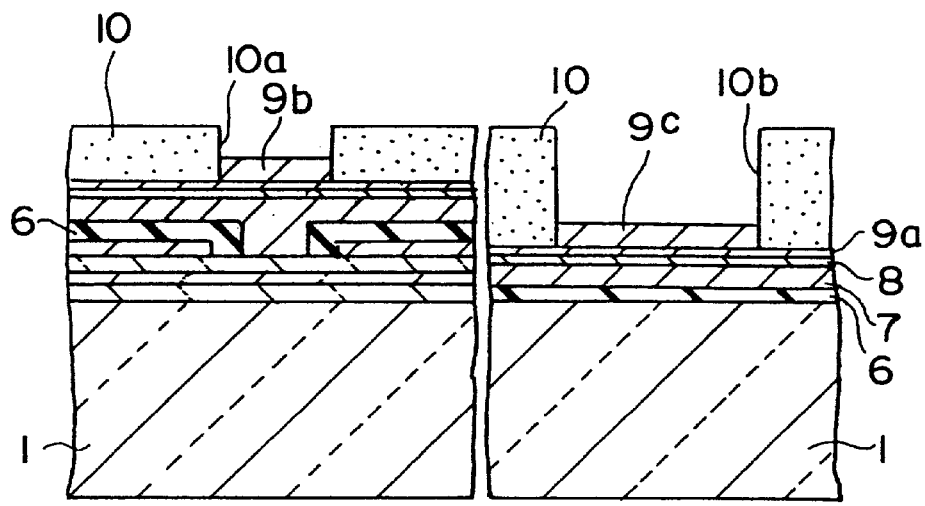

Then, as shown in FIG. 2D, photoresist 10 is coated on the first gold film 9a. By exposing/developing the photoresist 10, a first window 10a is formed in the gate forming region G and its peripheral region and also a second window 10b is formed in a part region of the capacitor forming region Y. Subsequently, a second gold film 9b and a third gold film 9c, both having a thickness of 300 to 1000 nm, are formed on the first gold film 9a exposed from two windows 10a, 10b of the photoresist 10 by the electrolytic plating.

Figure 2E:
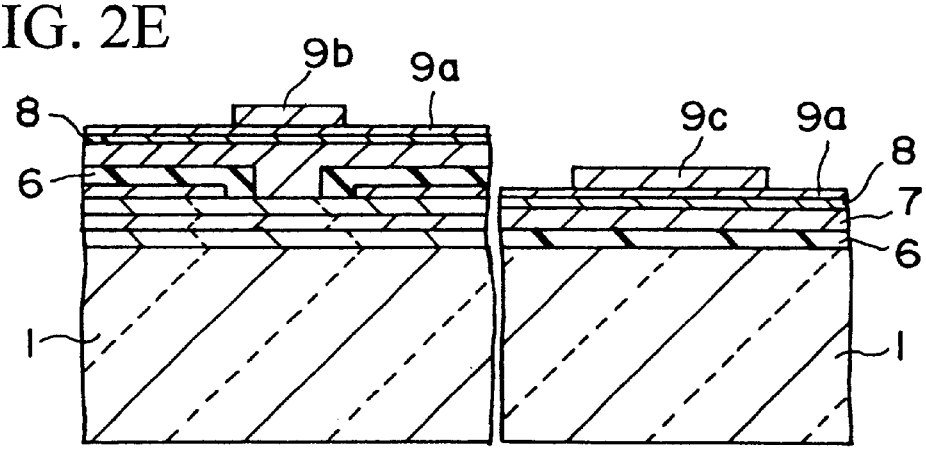

Then, as shown in FIG. 2E, the photoresist 10 is peeled off. Then, the first gold film 9a and the first titanium film 8 are etched by the dry etching method while using the second gold film 9b and the third gold film 9c as a mask. In this case, the thickness of the second gold film 9b and the third gold film 9c is made thin. In addition, the tungsten silicide film 7 is etched while using the second gold film 9b and the third gold film 9c as a mask.

Figure 2F:
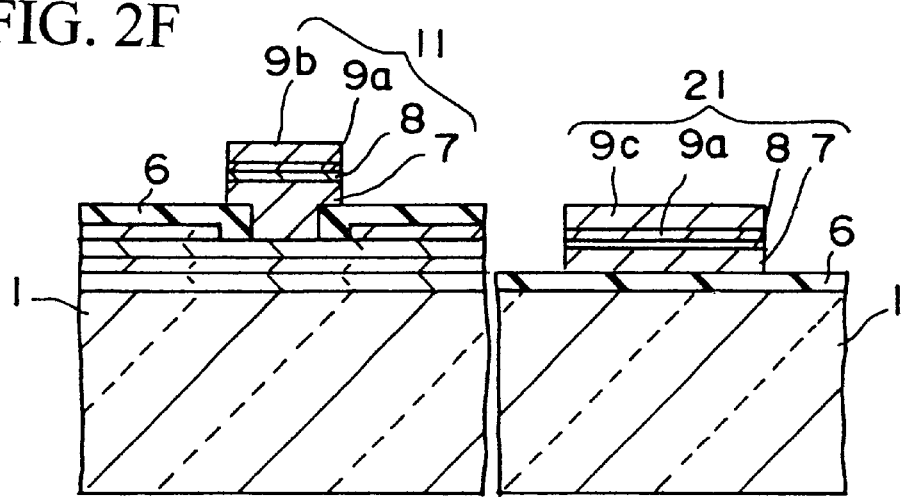

Thus, as shown in FIG. 2F, a gate electrode 11 consisting of the tungsten silicide film 7, the first titanium film 8, the first gold film 9a and the second gold film 9b is formed in the gate region and its peripheral region, and also a first electrode 21 consisting of the tungsten silicide film 7, the first titanium film 8, the first gold film 9a and the third gold film 9c is formed in the capacitor forming region Y. The first electrode 21 acts as the lower electrode of the capacitor.

Then, a dielectric film 22 of the capacitor is formed on the gate electrode 11, the first electrode 21 and the first insulating film 6 to have a thickness of 250 to 270 nm. As the dielectric film 22, a silicon nitride film whose hydrogen containing rate is less than 30 at. % is formed.

The silicon nitride film is formed by the plasma CVD method. As the growth conditions, for example, a mixed gas of silane ($SiH_4$) and nitrogen ($N_2$) is employed as a growth gas, a gas pressure is set to 0.4 to 0.6 Torr, a high frequency power applied to the plasma generating region is set to 400 to 420 W, and a substrate temperature is set to 240 to 260° C.

Figure 2G:
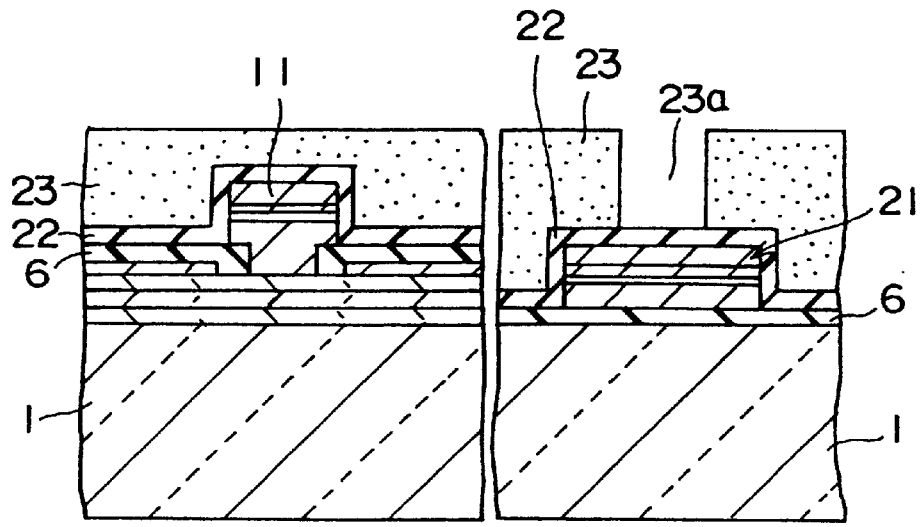

Then, as shown in FIG. 2G, photoresist 23 is coated on the dielectric film 22. Then, a window 23a is formed from a region over a part of the first electrode 21 to the outside by exposing/developing the photoresist 23.

Figure 2H:
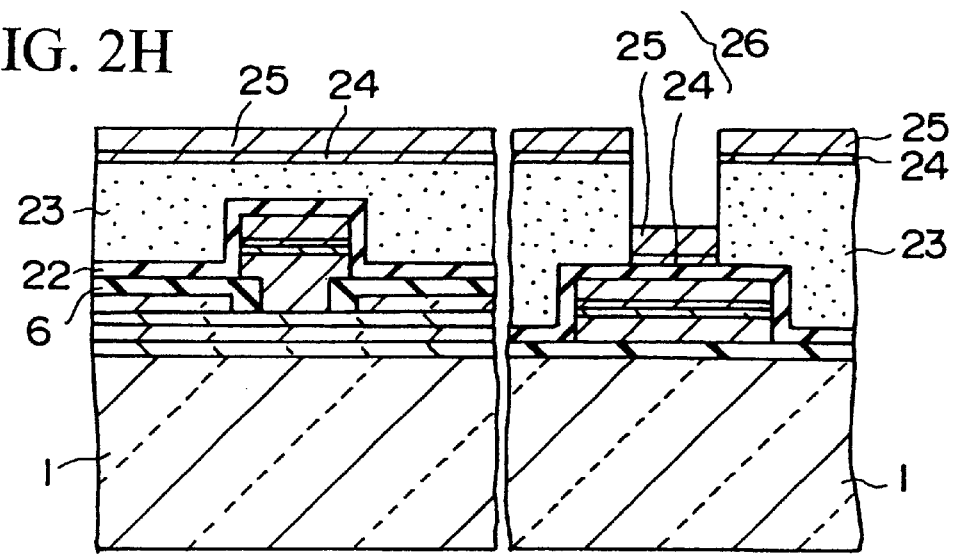

Then, as shown in FIG. 2H, a second titanium (Ti) film 24 of 60 to 80 nm thickness and a fourth gold film 25 of 190 to 210 nm thickness are formed in sequence on the dielectric film 22 exposed from the window 23a and on the photoresist 23 by the evaporation method.

Then, the second titanium film 24 and the fourth gold film 25 are left only from the region over a part of the first electrode 21 to the outside by removing the photoresist 23. These conductive films 24, 25 are used as a second electrode 26. The second electrode 26 acts as the upper electrode of the capacitor.

Figure 2I:
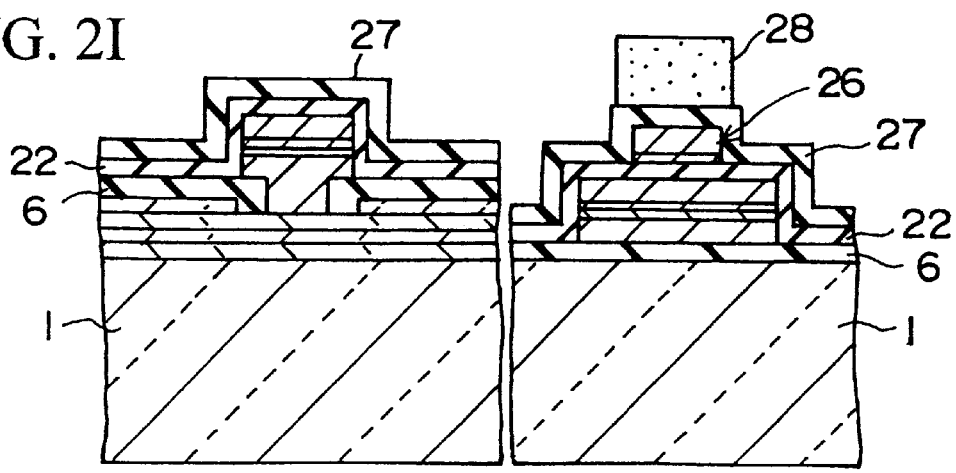

Then, as shown in FIG. 2I, a second insulating film 27 of 250 to 270 nm thickness is formed to cover the dielectric film 22 and the second electrode 26. The silicon nitride film is employed as the second insulating film 27 and the growth conditions are set similarly to the silicon nitride film applied to the dielectric film 22.

In turn, photoresist 28 is coated on the second insulating film 27 and then exposed/developed to be left selectively over the second electrode 26 and its peripheral region. In this case, the photoresist 28 is shaped to expose a part of the first electrode 21.

Figure 2J:
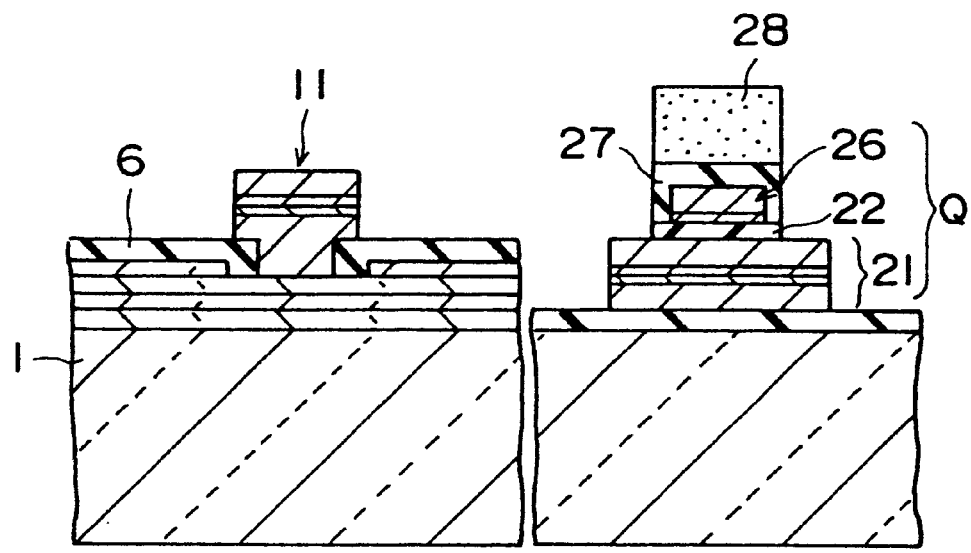

Then, as shown in FIG. 2J, the second insulating film 27 and the dielectric film 22 are removed by etching using the photoresist 28 as a mask.

Accordingly, since the second insulating film 27 and the dielectric film 22 are patterned to have the same planar shape in a region over the first electrode 21 and its outer region, the first electrode 21 is covered with the second insulating film 27 and the dielectric film 22. Also, the gate electrode 11 and the first insulating film 6 are exposed in the transistor forming region X.

The capacitor Q is composed of the first electrode 21, the dielectric film 22, and the upper electrode 26 which are left in the capacitor forming region Y.

Figure 3:
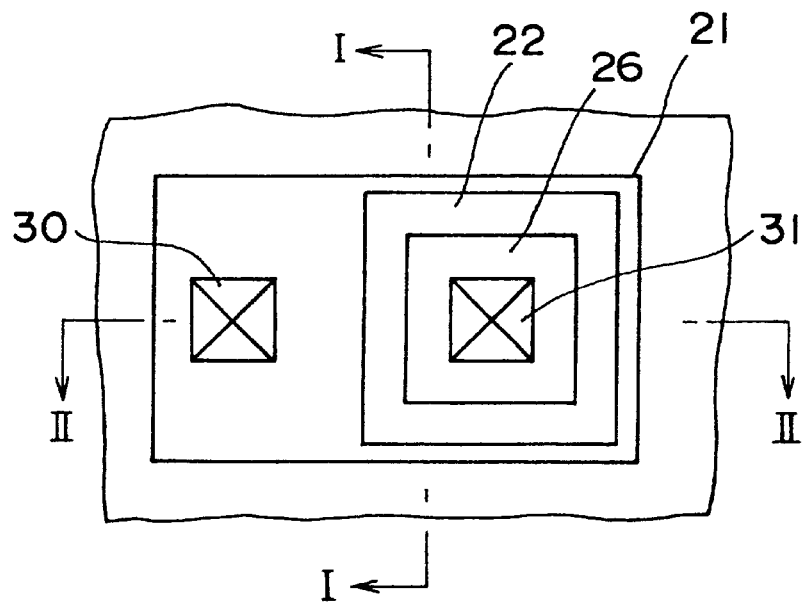
FIG. 3 is a plan view showing a capacitor according to the first embodiment of the present invention.

A plan view of the capacitor Q at this stage is shown in FIG. 3. A sectional shape taken along a line II—II in FIG. 3 is shown in FIG. 2J. In FIG. 3, a reference 30 denotes a contact hole which is formed in the insulating film on the first electrode 21, and a reference 31 denotes a contact hole which is formed in the insulating film on the second electrode 26.

After the photoresist 28 is removed, openings are formed on the cap layers 5a, 5b respectively by patterning the first insulating film 6, which exits in the transistor forming region X, by virtue of the photolithography. Then, a source electrode 12 and a drain electrode 13 are formed on the cap layers 5a, 5b respectively via the openings. Accordingly, a basic configuration of the high electron mobility transistor (HEMT) is formed.

Figure 2K:
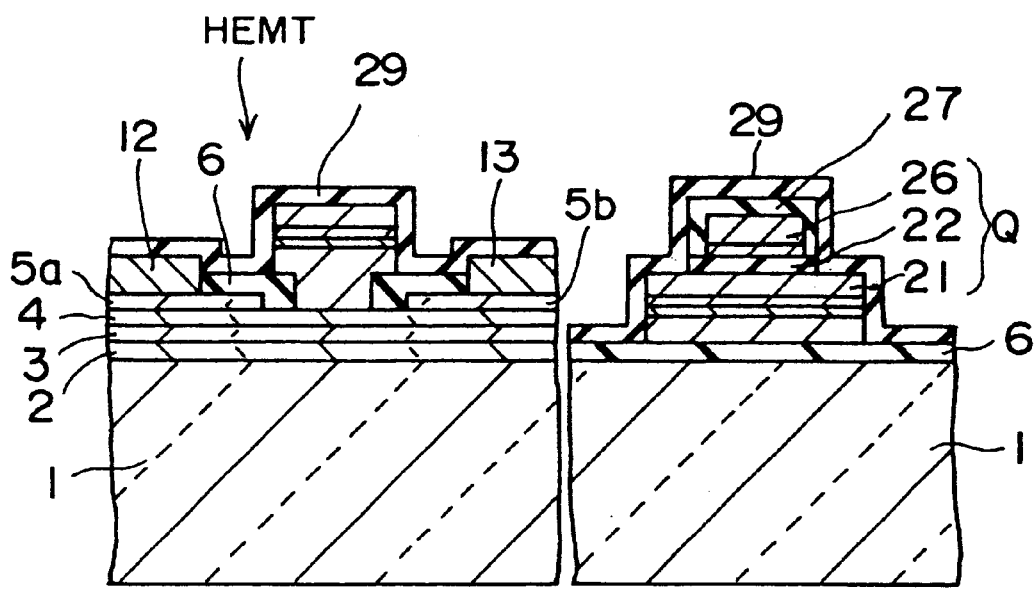

Then, as shown in FIG. 2K, an insulating protective film 29 of 40 to 60 nm thickness and with good coverage is formed on the HEMT, which consists of the gate electrode 11, the source electrode 12, the drain electrode, etc., and the capacitor Q respectively.

As the insulating protective film 29, a silicon nitride film whose hydrogen containing rate is more than 30 at. % and which has low density is employed.

The silicon nitride film is formed by the UV (ultraviolet)-CVD method. As the growth conditions, a mixed gas of silane ($SiH_4$) and nitrogen ($N_2$) is employed as a growth gas, a gas pressure is set to 2 to 4 Torr, and a substrate temperature is set to 200 to 400° C.

Figure 4:
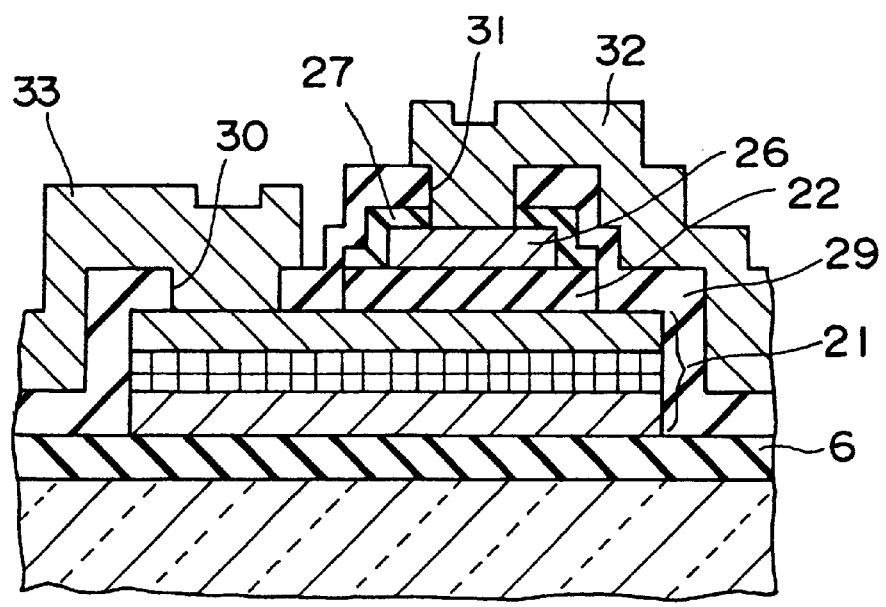
FIG. 4 is a sectional view showing a sectional structure taken along a line II—II in FIG. 3.

Then, the insulating protective film 29 and the second insulating film 27 are patterned by the photolithography method to form the contact holes 30, 31, and then leading electrodes 32, 33 are formed from the contact holes 30, 31 to the outside. A sectional shape, if viewed from a line II—II in FIG. 3, is shown in FIG. 4. A reference 32 denotes the leading electrode connected to the second electrode 26 via the contact hole 31, and reference 33 denotes the lead electrode connected to the first electrode 21 via the contact hole 30.

By the way, the above insulating protective film 29 covers the second electrode 26 via the second insulating film 27 whose hydrogen containing rate is more than 30 at. % and which has a thickness of 90 to 110 nm. Since the second insulating film 27 is hard to flow the current because of its high density, the leakage current is difficult to flow between the first electrode 21 and the second electrode 26 with the intervention of the insulating protective film 29.

Figure 5:
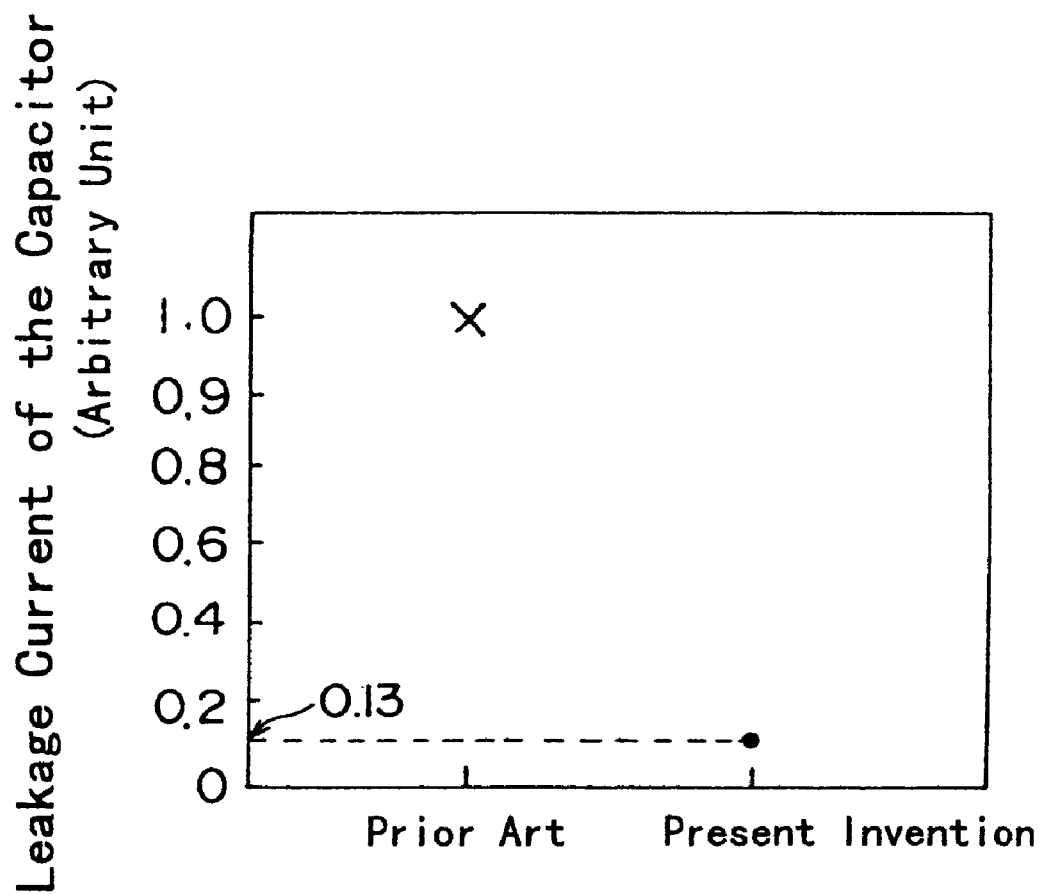
FIG. 5 is a characteristic view showing a leakage current of the capacitor according to the first embodiment of the present invention and the leakage current of the capacitor in the prior art.

The results as shown in FIG. 5 can be derived when the leakage current of the capacitor Q according to the first embodiment and the leakage current of the capacitor without the intervention of the second insulating film 27 in the prior art are compared with each other. It can be seen that the leakage current of the capacitor Q according to the first embodiment can be reduced in one digit rather than the capacitor in the prior art.

(Second Embodiment)

In the above first embodiment, a configuration in which a part of the first electrode 21 is covered with the dielectric film 22 is employed. Similarly, a capacitor structure in which the whole first electrode 21 is covered with the dielectric film 22 may be employed.

The steps of manufacturing such capacitor will be explained hereunder.

Figure 6A:
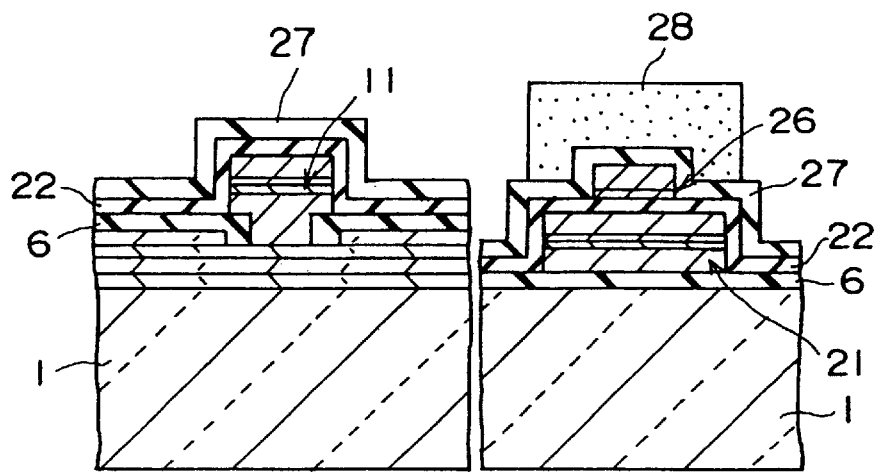
FIGS. 6A to 6C are showing steps of manufacturing a compound semiconductor device according to a second embodiment of the present invention.

First, as shown in FIG. 2I, the second insulating film 27 is formed, and then the region covered with the resist 28 is expanded up to the first electrode 21 and its peripheral region, as shown in FIG. 6A.

Figure 6B:
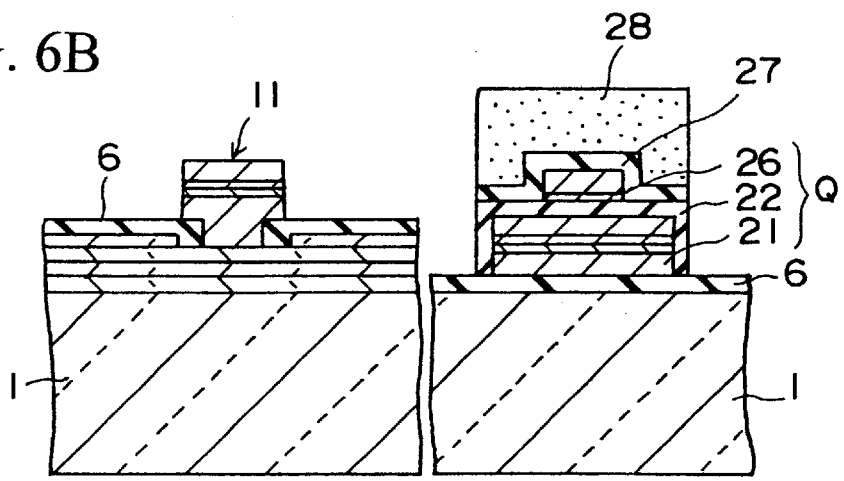

Then, as shown in FIG. 6B, when the second insulating film 27 and the dielectric film 22 are etched using the resist 28 as a mask, the entire first electrode 21 is covered with the second insulating film 27 and the dielectric film 22. In this case, since the second insulating film 27 and the dielectric film 22 are removed from the transistor forming region X, there is no possibility of applying the stress to the compound semiconductor layer by the second insulating film 27 and the dielectric film 22.

Figure 7:
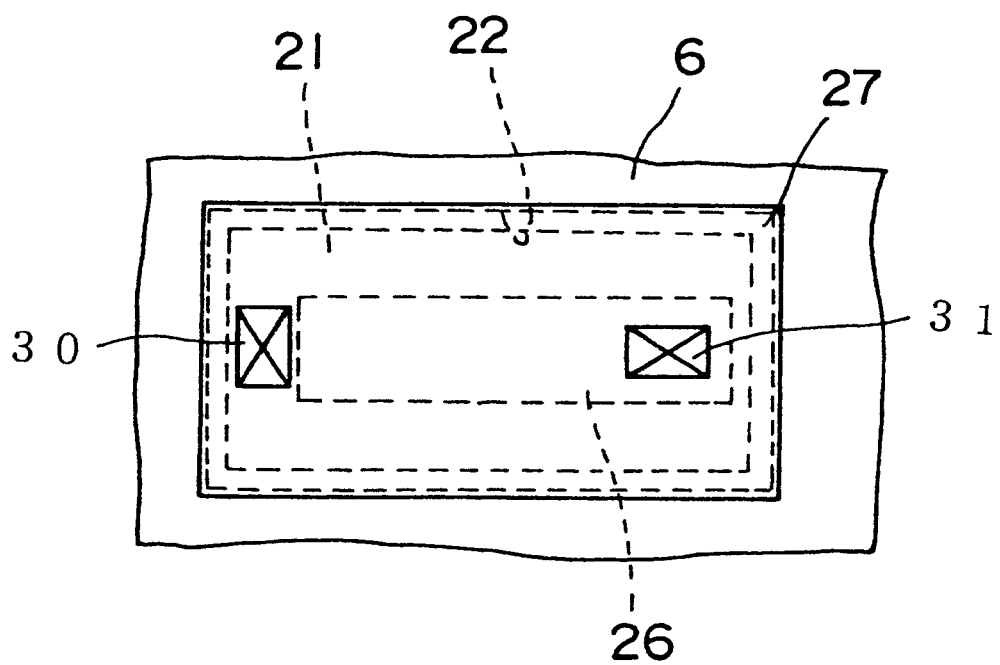
FIG. 7 is a plan view showing a capacitor according to the second embodiment of the present invention.

A plan view of the capacitor forming region Y after the resist 28 is removed is shown in FIG. 7.

Figure 6C:
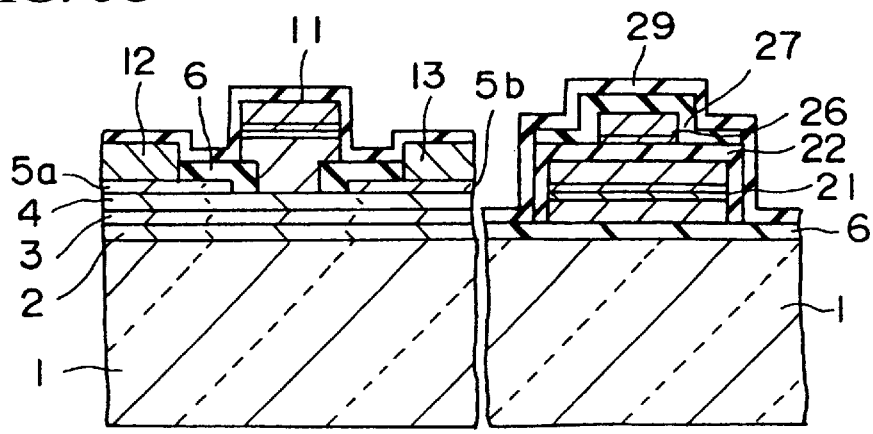

After the resist 28 is removed, as shown in FIG. 6C, openings are formed on the cap layers 5a, 5b respectively by patterning the first insulating film 6, which exists in the transistor forming region X, by virtue of the photolithography method. Then, the source electrode 12 and the drain electrode 13 are formed on the cap layers 5a, 5b via the openings respectively. Accordingly, a basic configuration of the high electron mobility transistor (HEMT) is formed.

Then, the insulating protective film 29 of 40 to 60 nm thickness and with good coverage is formed on the HEMT, which consists of the gate electrode 11, the source electrode 12, the drain electrode 13, etc., and the capacitor Q respectively. As the insulating protective film 29, the silicon nitride film whose hydrogen containing rate is more than 30 at. % and which has low density is employed.

In the second embodiment, the first electrode 21 and the second electrode 26 are covered with the second insulating film 27 and the dielectric film 22, both having high density, and then an overall resultant structure is covered with the insulating protective film 29 which has good coverage and low density. Therefore, both the first electrode 21 and the second electrode 26 do not come directly into contact with the insulating protective film 29 which is easy to flow the leakage current.

As the second insulating film 27 employed in the above first and second embodiments, silicon nitride oxide ($SiO_xN_y$ (x, y are component number)) whose hydrogen containing rate is less than 30 at. % may be employed in place of the silicon nitride.

As described above, according to the present invention, in the capacitor including the first electrode, the dielectric film, and the second electrode, the first electrode is selectively covered with the insulating film which has the low hydrogen containing rate, and also all the capacitor including the insulating film and the substrate are covered with the insulating protective film which has good coverage and has the high hydrogen containing rate. Therefore, direct contact of the first electrode and the second electrode can be avoided by the insulating protective film, so that the leakage current can be prevented from flowing between the first electrode and the second electrode via the insulating protective film.

What is claimed is:

1. A method of manufacturing a compound semiconductor device comprising the steps of:

forming a first electrode of a capacitor and a gate electrode of a transistor on a compound semiconductor substrate via a first insulating film;

forming a dielectric film of the capacitor on the first electrode;

forming a second electrode of a capacitor on the dielectric film;

forming a second insulating film having a hydrogen content which covers the second electrode, the dielectric film, and the first electrode;

patterning the second insulating film by using a mask to leave the second insulating film covering directly an upper surface and both side surfaces of the second electrode to surround the second electrode with the dielectric film; and forming an insulating protective film which covers the second insulating film, the dielectric film, and the first electrode, and has a hydrogen content larger than that of the second insulating film.

2. A method of manufacturing a compound semiconductor device according to claim 1, further comprising the step of patterning the dielectric film successively using the mask after the second insulating film is patterned.

3. A method of manufacturing a compound semiconductor device according to claim 2, wherein the dielectric film is left only on the first electrode.

4. A method of manufacturing a compound semiconductor device according to claim 1, wherein the second insulating film is formed by a plasma CVD method, and the insulating protective film is formed by a ultraviolet CVD method.

5. A method of manufacturing a compound semiconductor device according to claim 4, wherein formation of the second insulating film and formation of the insulating protective film are executed under a condition that a temperature of the compound semiconductor substrate is set to less than 400° C.

6. A method of manufacturing a compound semiconductor device according to claim 1, wherein the transistor is covered with the insulating protective film.

* * * * *